(12) United States Patent
Jiang

(10) Patent No.: US 8,134,418 B2
(45) Date of Patent: Mar. 13, 2012

(54) VARACTOR CIRCUIT AND VOLTAGE-CONTROLLED OSCILLATION

(75) Inventor: Xuewen Jiang, Chandler, AZ (US)

(73) Assignee: Xilinx, Inc., San Jose, CA (US)

( * ) Notice: Subject to any disclaimer, the term of this patent is extended or adjusted under 35 U.S.C. 154(b) by 6 days.

(21) Appl. No.: 12/759,658

(22) Filed: Apr. 13, 2010

(65) Prior Publication Data

US 2011/0248787 A1     Oct. 13, 2011

(51) Int. Cl.
*H03C 3/20*     (2006.01)
*H03B 5/12*     (2006.01)

(52) U.S. Cl. ............... 331/177 V; 331/36 C; 331/117 R

(58) Field of Classification Search ............... 331/36 C, 331/117 FE, 117 R, 167, 177 V
See application file for complete search history.

(56) References Cited

U.S. PATENT DOCUMENTS

| | | | |
|---|---|---|---|
| 6,292,065 B1 * | 9/2001 | Friedman et al. | 331/117 R |
| 6,650,195 B1 * | 11/2003 | Brunn et al. | 331/177 V |
| 6,657,509 B1 * | 12/2003 | Ohannes | 331/177 V |
| 6,759,727 B2 | 7/2004 | Ju | |
| 6,930,562 B2 * | 8/2005 | Takinami et al. | 331/117 R |
| 7,015,768 B1 * | 3/2006 | Talwalkar | 331/177 V |
| 7,098,751 B1 * | 8/2006 | Wong | 331/177 V |
| 7,292,115 B2 * | 11/2007 | Soltanian et al. | 331/167 |

FOREIGN PATENT DOCUMENTS

| | | |
|---|---|---|
| EP | 1 505 721 A1 | 9/2005 |
| EP | 1 988 628 A1 | 4/2007 |

OTHER PUBLICATIONS

U.S. Appl. No. 12/699,734, filed Feb. 3, 2010, Chong, Nui et al., Xilinx, Inc. 2100 Logic Drive, San Jose, California 95124 USA.
Bunch, Ryan et al., "Large-Signal Analysis of MaS Varactors in CMOS-GM LC VCO's", IEEE JSSC, Aug. 2003, pp. 1325.
Andreani, Pietro et al., "On the Use of MOS Varactors in RF VCO's", IEEE JSSC, Jun. 2000, pp. 905.

* cited by examiner

*Primary Examiner* — Levi Gannon
(74) *Attorney, Agent, or Firm* — W. Eric Webostad; John J. King

(57) ABSTRACT

A varactor circuit and voltage-controlled oscillation are described. The varactor circuit includes a first varactor, a second varactor, a third varactor, and a fourth varactor. A first source-drain node of the first varactor and a second source-drain node of the second varactor are coupled to a first input node. A first gate node for the first varactor is coupled to a first output node. A second gate node for the second varactor is coupled to a second output node. A third gate node for the third varactor and a fourth gate node for the fourth varactor are coupled to a second input node. A third source-drain node of the third varactor is coupled to the first output node. A fourth source-drain node of the fourth varactor is coupled to the second output node. In other embodiments, varactor circuits block and re-center VCO output CML.

19 Claims, 9 Drawing Sheets

VARACTOR CIRCUIT AND VOLTAGE-CONTROLLED OSCILLATION

FIELD OF THE INVENTION

An embodiment of the invention relates to integrated circuit devices ("ICs"). More particularly, an embodiment of the invention relates to a varactor circuit and voltage-controlled oscillation for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Voltage-controlled oscillators ("VCOs") are building blocks in many high performance analog circuits and systems. For example, VCOs are used in frequency synthesizers, clock multiplication units ("CMUs"), clock and data recovery ("CDR") circuits, and phase-locked-loops ("PLLs"), among other circuits. VCOs have been implemented with CMOS. The benefits of leveraging high-volume CMOS fabrication for analog and RF devices would be useful. For example, it would be useful if such integration of VCOs was complete, namely forming a VCO entirely in a single-chip, such as in an SOC implementation for example. Some design considerations for VCOs are tuning range and jitter performance. In PLDs, these design considerations may be more stringent because a single PLD may be used to support multiple protocols and applications with different clock frequency performance parameters and with stringent jitter performance parameters.

Accordingly, it would be desirable and useful to provide a high gain varactor circuit capable of meeting stringent jitter performance parameters over a relatively large tuning range to provide a VCO suitable for an application where a single PLD supports multiple protocols and applications.

A VCO "tank" circuit is a well-known circuit for generating oscillations. VCO circuits, like the tank circuit, are known as LC VCOs, where the L and C respectively indicate inductor and capacitor. A tank capacitance "C" in an LC VCO is a combination of a fixed capacitance and a tunable capacitance. The tunable capacitance conventionally includes a varactor. However, a conventional varactor has a relatively limited capacitive range. Furthermore, as is known, CMOS processes may vary from time to time and thus a capacitance-voltage ("C-V") curve may shift. Heretofore, such a process shift may reduce the useable range of the varactor capacitance.

Accordingly, it would be both useful and desirable to provide a varactor circuit that is programmable for a wide range of capacitances. Moreover, it would be useful and desirable to enhance a varactor's C-V curve gain beyond a device intrinsic C-V curve property. It would additionally be useful and desirable if such varactor circuit could be adjusted to offset process variation.

SUMMARY OF THE INVENTION

One or more embodiments generally relate to a varactor circuit and method for voltage-controlled oscillation for an IC.

An embodiment relates generally to a varactor circuit. In such an embodiment, the varactor circuit includes a first varactor, a second varactor, a third varactor, and a fourth varactor. A first source-drain node of the first varactor and a second source-drain node of the second varactor are coupled to a first input node. A first gate node of the first varactor is coupled to a first output node. A second gate node of the second varactor is coupled to a second output node. A third gate node of the third varactor and a fourth gate node of the fourth varactor are coupled to a second input node. A third source-drain node of the third varactor is coupled to the first output node. A fourth source-drain node of the fourth varactor is coupled to the second output node.

Another embodiment relates generally to a voltage-controlled oscillator. In such an embodiment, a voltage-controlled oscillator includes a varactor circuit coupled in parallel with an inductor circuit at a first output node and a second output node. A first pair of cross-coupled transistors is coupled to the varactor circuit and the inductor circuit at the first output node and the second output node. A bias transistor is coupled between the first pair of cross-coupled transistors and ground. A gate of the bias transistor is coupled for receiving a bias voltage. The varactor circuit includes a first varactor, a second varactor, a third varactor, and a fourth varactor. A first source-drain node of the first varactor and a second source-drain node of the second varactor are coupled to a first input node. A first gate node of the first varactor is coupled to the first output node. A second gate node of the second varactor is coupled to the second output node. A third gate node of the third varactor and a fourth gate node of the fourth varactor are coupled to a second input node. A third source-drain node of the third varactor is coupled to the first output node. A fourth source-drain node of the fourth varactor is coupled to the second output node.

In yet another embodiment of a method for providing a programmable voltage-controlled oscillation. In such an embodiment, a first control voltage to a first pair of varactors is provided, and a second control voltage to a second pair of varactors is also provided. The first control voltage has a first voltage range, the second control voltage has a second voltage range, and the first voltage range and the second voltage range are associated with a gate-to-source voltage range of high capacitive gain range. The first control voltage and the second control voltage in combination provide a differential input. The first pair of varactors are operated in a first mode, and the second pair of varactors are operated in a second mode. The first mode and the second mode are complementary modes. The differential input in combination with the complementary modes provides the high capacitive gain range associated with operation of the first pair of varactors and the second pair of varactors in combination. A first sinusoidal output voltage and a second sinusoidal output voltage are outputs having a frequency programmed responsive to the differential input and having a programmable frequency range responsive to the high capacitive gain range.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
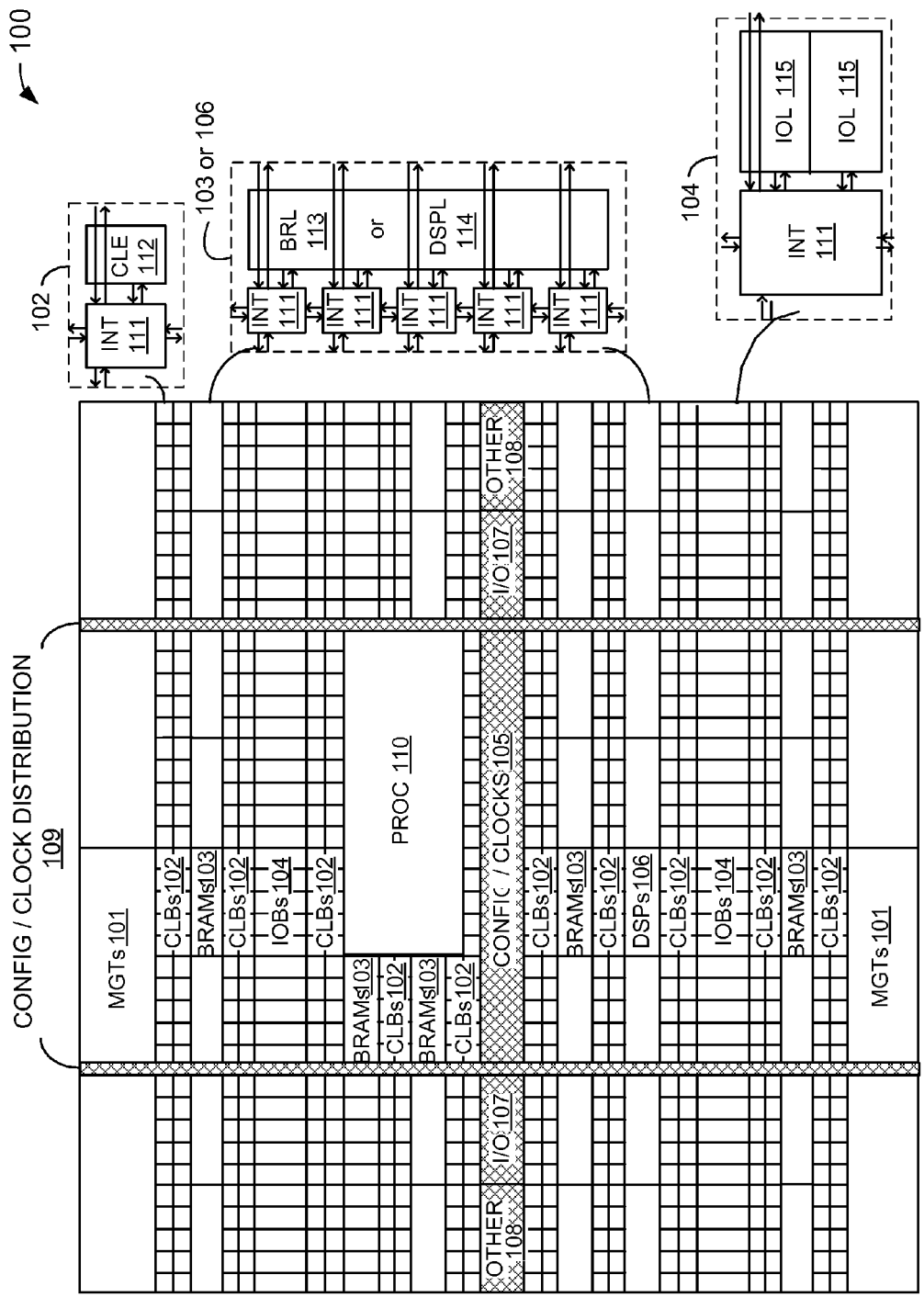
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
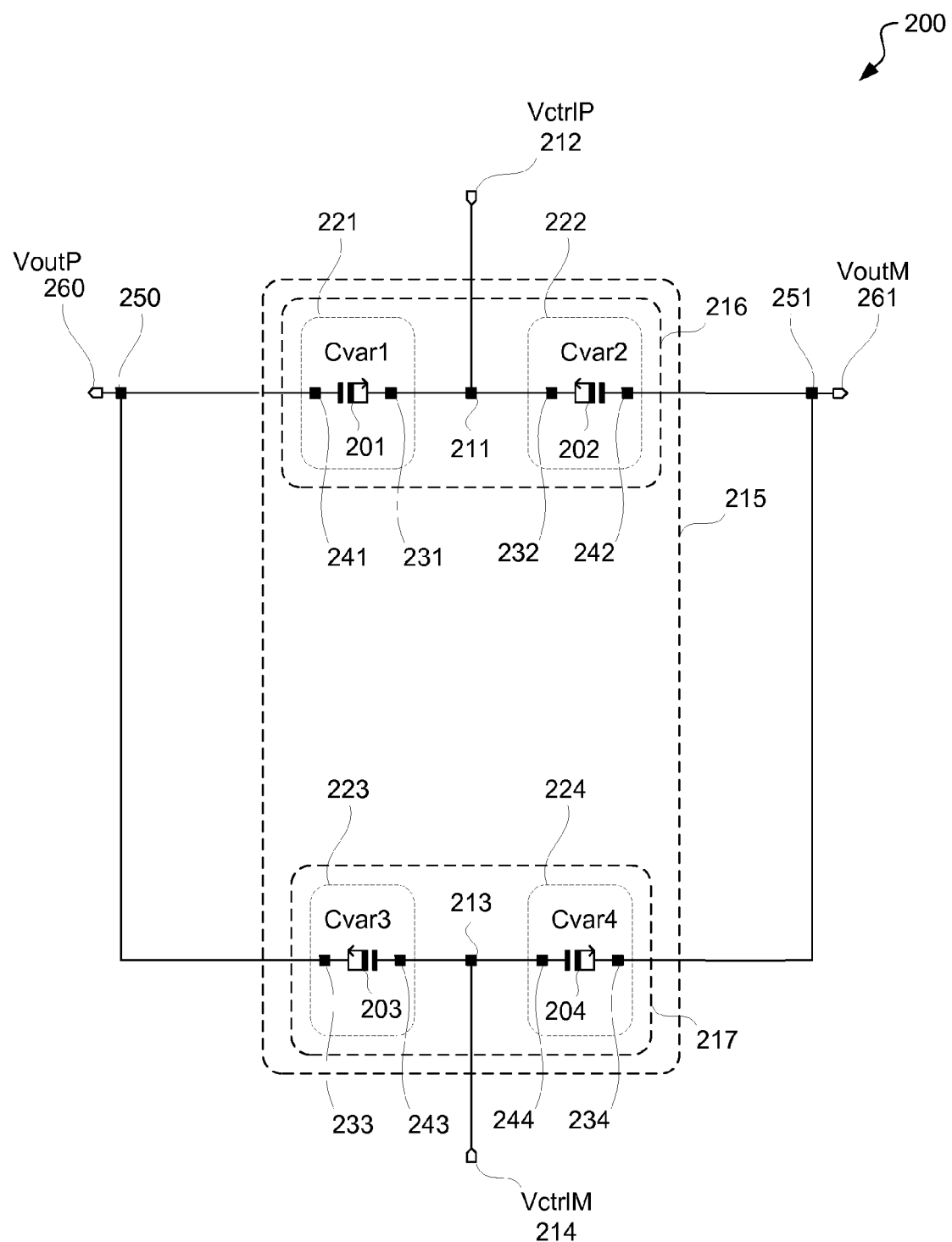
FIG. 2 is a circuit diagram depicting an exemplary embodiment of a varactor circuit.

FIG. 2 is a circuit diagram depicting an exemplary embodiment of a varactor circuit 200. Varactor circuit 200 includes a first varactor 201, a second varactor 202, a third varactor 203, and fourth varactor 204. Varactors 201 through 204 are MOS transistor-like devices with drain and source regions connected to one another. It should be understood that varactors 201 through 204 may be implemented in any CMOS process. Furthermore, varactors 201 through 204 may be used where a capacitance value, which may be tunable or otherwise adjusted by at least one voltage, is to be implemented. More particularly, varactors 201 through 204 are accumulation-mode MOS variable capacitors.

Figure 3:
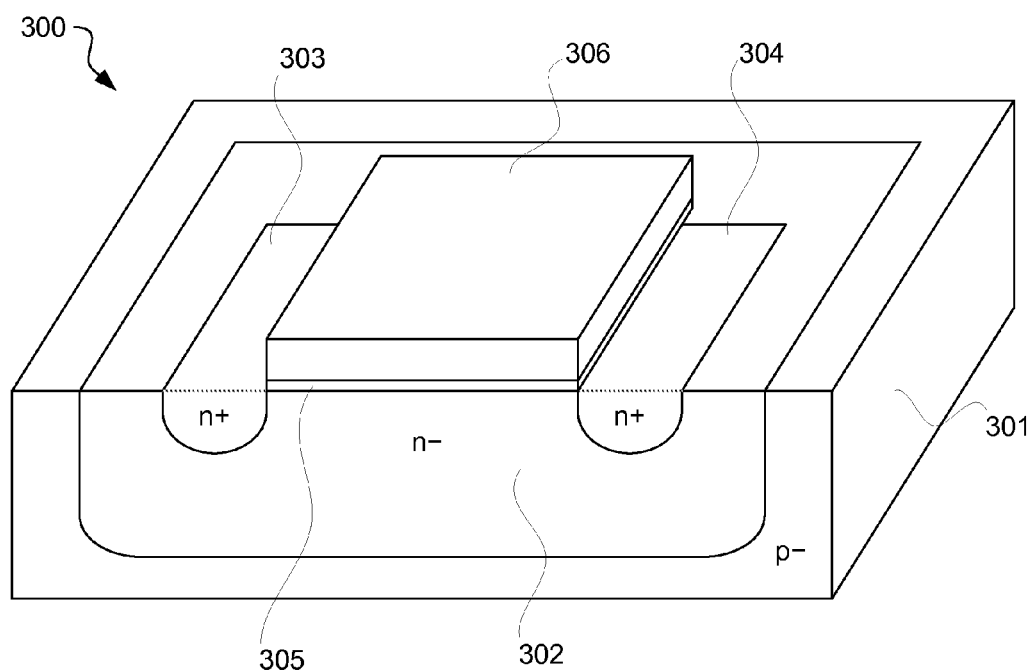
FIG. 3 is a cross-sectional perspective view depicting an exemplary embodiment of an accumulation-mode MOS capacitor, namely an A-MOS varactor.

FIG. 3 is a cross-sectional perspective view depicting an exemplary embodiment of an accumulation-mode MOS capacitor, namely an A-MOS varactor 300. A-MOS varactor 300 is a configuration that may be used by varactors 201 through 204. In this exemplary embodiment, a p-type substrate 301 has formed therein an n-well 302. In n-well 302 are formed source/drain regions 303 and 304, which in this exemplary embodiment are both n+ regions. Located between spaced apart source/drain regions 303 and 304 on an upper surface of substrate 301 in the region of well 302 is a gate dielectric 305, and formed above gate dielectric 305 is a conductive gate 306. As A-MOS varactor 300 is known, known details regarding same have been omitted for purposes of clarity. However, it should be understood that even though an n-type A-MOS varactor 300 is illustratively depicted in FIG. 3, a reverse polarity varactor, namely a p-type A-MOS varactor, may be implemented, such as for varactors 201 through 204 in another embodiment. Furthermore, even though some exemplary doping concentrations have been indicated, it should be understood that these or other doping concentrations may be used.

Returning to FIG. 2, a voltage control input node 211 is coupled to receive a control voltage 212. Furthermore, a voltage control input node 213 is coupled to receive a control voltage 214. Control voltage 212 and control voltage 214 may be the same voltage. However, by having two separate input control voltages, a differential control voltage input is provided where a wider capacitance range may be obtained than in a single control voltage input embodiment. Accordingly, the following description is in terms of a differential control voltage input as provided via control voltages 212 and 214.

Control voltage 212 is designated with a "P" in FIG. 2 to indicate that it is for one control voltage range, and control voltage 214 is indicated with an "M" in FIG. 2 to indicate that it has a separate control voltage range which may be complementary to the control voltage range of control voltage 212. For example, for a supply voltage of approximately 1.2 volts, control voltage range of control voltage 212 may be from approximately 0.3 volts to approximately 0.9 volts, and control voltage range of control voltage 214 may be from approximately 0.9 volts to approximately 0.3 volts. Thus, for example, if control voltage 212 was set at 0.3 volts, control voltage 214 may be set at 0.9 volts. Because the ranges for control voltages 212 and 214 are the same, though complementary with respect to one another, the designations of "P" and "M" are generally referred to as plus and minus, respectively.

Control voltages 212 and 214 are DC voltages. In an implementation of a varactor, such as in a VCO or other voltage-controlled feedback system for example, there may be some voltage noise or ripple in one or more of such control voltages coupled from supply noise. However, by having differential voltage control, such as by differential input control voltages 212 and 214, supply rejection may be improved. In other words, because control voltages 212 and 214 are more likely to move together, namely both move either in a positive or negative direction at the same time, if they should deviate from their set voltage levels, such as due to supply noise coupled, the difference between such control voltages may move very little, if at all, as the shifts of the two control voltages are in same direction for both. Thus, for example, if control voltages 212 and 214 are subject to noise injection or coupling, the difference between such control voltages may be same as it was prior to such disturbance. By having the difference stable responsive to differential control input voltage, the likelihood of phase noise due to perturbation, thermal variation, electrical floating, or other form of noise coupling in control voltage input is at least substantially reduced. Furthermore, if phase noise occurs, such phase noise is substantially limited.

With simultaneous reference to FIGS. 2 and 3, varactors 201 through 204 may be formed in a same well, such as n-well 302, as generally indicated by dashed box 215. In another embodiment, separate wells such as separate wells 302, may be used for pairs of varactors, as generally indicated by dashed boxes 216 and 217 for a pair of varactors 201 and 202 and a pair of varactors 203 and 204, respectively. In yet another embodiment, separate wells, such as individual wells 302, for each of varactors 201 through 204 as generally indicated by dashed boxes 221 through 224 may be used. However, it should be understood that variability in MOS device operation may occur due to differences in diffusion or doping or a combination thereof. Thus, for a CMOS process on the order of 35 nanometers ("nm") or less, configurations which reduce the likelihood of such variation among devices may be useful. In the exemplary embodiment depicted, A-MOS varactors 201 through 204 may be configured to generally have the same operational parameters. Accordingly, forming all of such varactors 201 through 204 in a same well 302, such as generally indicated by dashed box 215, may facilitate forming of varactors 201 through 204 to be at least substantially operatively identical. By having varactors 201 through 204 with at least substantially equivalent performance characteristics, a balanced circuit for varactor circuit 200 may be implemented.

Varactors 201 and 202 are configured opposite varactors 203 and 204. In other words, varactor pair 201 and 202 operate in a first mode and varactor pair 203 and 204 operate in a second mode, where the second mode and the first mode are complementary modes with respect to one another. Thus, varactor circuit 200 may be thought of as a complementary mode, differential input varactor configured to operate in an accumulation mode.

With simultaneous reference to FIGS. 2 and 3, source/drain regions 303 and 304 of varactor 201 are connected to a source/drain node 231, and source/drain node 231 is coupled to control voltage input node 211. Likewise, varactor 202 has its source/drain regions 303 and 304 connected to source/drain node 232, which is coupled to control voltage input node 211. A gate 306 of varactor 201 is connected to gate node 241, and a gate 306 of varactor 202 is connected to gate node 242.

A gate 306 of varactor 203 is connected to gate node 243, which is coupled to control voltage input node 213. Likewise, a gate 306 of varactor 204 is connected to gate node 244, which is coupled to control voltage input node 213. Source/drain regions 303 and 304 of varactor 203 are connected to source/drain node 233, and source/drain 303 and 304 regions of varactor 204 are connected to source/drain node 234.

Nodes 233 and 241 are coupled to output voltage node 250, and nodes 234 and 242 are coupled to output voltage node 251. It should be understood that in an implementation where varactor circuit 200 is part of a tank circuit, such as for a VCO, output voltages sourced at nodes 250 and 251 are sinusoidal voltages. Voltages at voltage output nodes 250 and 251 may be maintained at least approximately 180 degrees out of phase with one another. Accordingly, the "P" designation is used for voltage output from node 250, namely a plus side output voltage ("VoutP") 260, and the "M" designation is used for output voltage at output voltage node 251, namely a minus side output voltage ("VoutM") 261.

Generally, output voltages 260 and 261 respectively at nodes 250 and 251, are the same sinusoidal voltage, only maintained at 180 degrees out of phase from one another. However, there may be some variation in this 180 degree phase relationship due to phase noise.

In the following description, it is assumed that a balanced circuit implementation for varactor circuit 200 is to be implemented. However, there may be applications in which an imbalanced circuit is to be implemented in order to have a different relationship than the one described herein between output voltages 260 and 261 respectively at nodes 250 and 251. Thus, it should be understood that varactors 201 through 204 may intentionally be different from one another. However, for purposes of clarity by way of example and not limitation, it shall be assumed that a balanced circuit implementation is to be used.

Figure 4A:
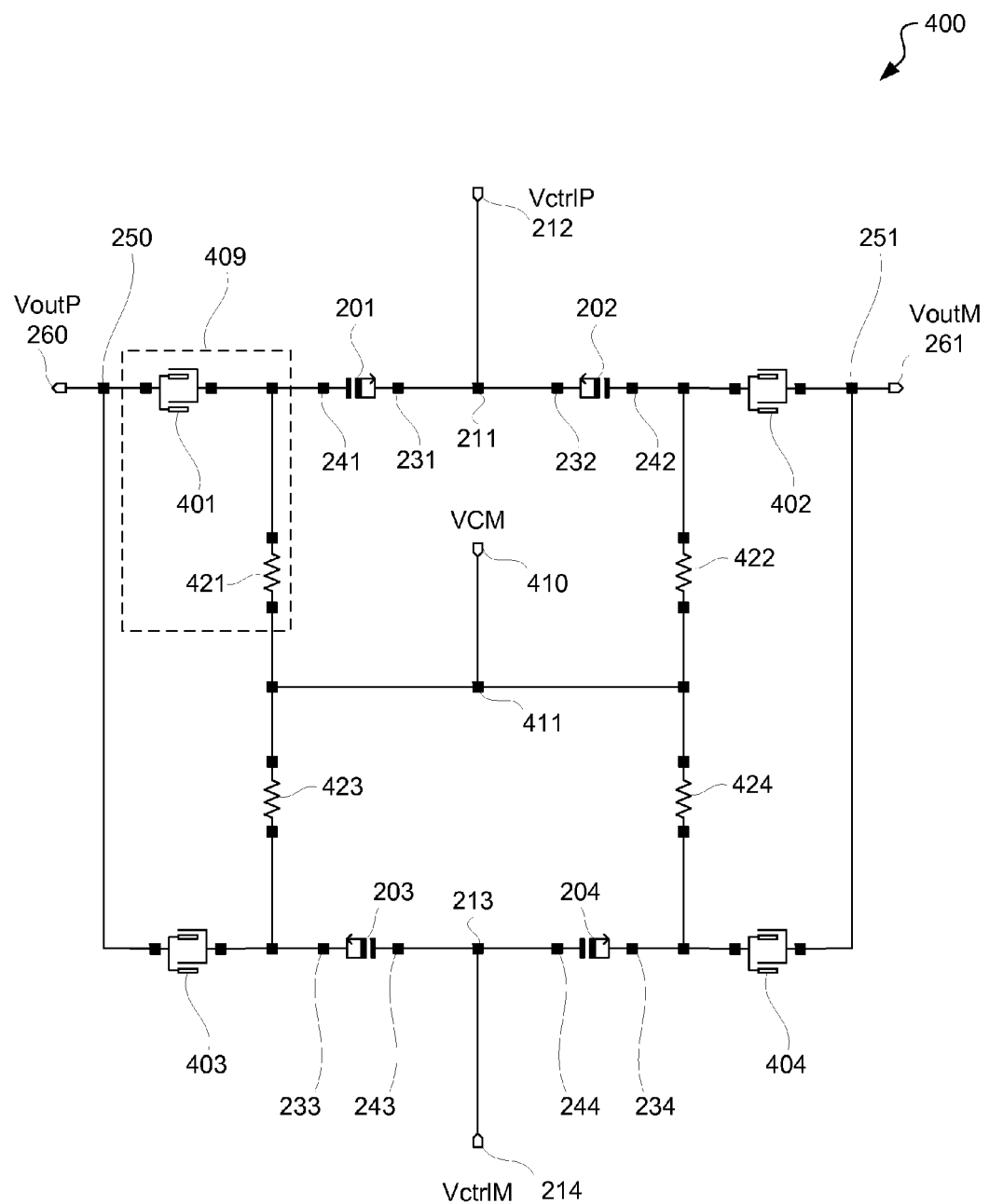
FIG. 4A is a circuit diagram depicting an exemplary embodiment of an AC coupled differential varactor circuit.

FIG. 4A is a circuit diagram depicting an exemplary embodiment of an AC coupled differential varactor circuit 400. Varactor circuit 400 may be for an LC resonator-based PLL or other application for an AC coupled differential varactor circuit. Differential varactor circuit 400, as well as varactor circuit 200 of FIG. 2, provide a wide LC PLL frequency tuning range by increasing an associated intrinsic varactor C-V curve gain and improves LC PLL supply noise immunity with a differential control voltage topology. Again, a differential control voltage provides improved supply noise immunity as compared with a single-ended control voltage implementation. Thus, even though a single-ended control voltage implementation may be used as described herein, a differential control voltage embodiment is described for purposes of clarity.

Differential varactor circuit 400, like varactor circuit 200 of FIG. 2, includes varactors 201 through 204, or more particularly, A-MOS varactor capacitors 201 through 204, as was previously described with reference to FIG. 2. Accordingly, such description is not repeated here for purposes of clarity.

Again, a complementary varactor structure is used to realize differential control voltage tuning such that an LC VCO may be at least substantially immune to supply noise coupled onto a voltage control signal line. In both varactor circuits 200 and 400, varactors 201 and 202 are the same function for either a left or right branch, respectively, of a differential LC VCO, and likewise, varactors 203 and 204 are the same function but for left and right branches, respectively. Thus, varactors 201 and 203, as well as varactors 202 and 204, have complementary functions. For example varactor 201 has its source and drain regions connected to receive control voltage P 212 and its gate coupled to an LC side, and varactor 203 has its source and drain regions coupled to the LC side and its gate coupled to receive control voltage M 214. With respect to varactor circuit 400, the LC side is after AC couple 409 for example. Varactor 203 is a complement function to varactor 201 because it is operating with opposite connectivity. Varactor 203 has its source and drain regions connected to an LC side, namely to output node 250 after an AC couple 409 formed by capacitor 403 and resistor 423, and its gate coupled to control voltage M 214. Likewise, varactors 202 and 204 have complementary functions with respect to one another within varactor circuits 200 and 400. Accordingly, varactor circuits 200 and 400 are differential varactor circuits which may be differentially tuned with response to control voltages 212 and 214, as described below in additional detail.

AC couples, such as AC couple 409 formed by a capacitor 401 and a resistor 421, are for blocking common mode voltage, such as common mode voltage from intrinsic LC VCO outputs, which equals to ½*(node 260+node 261). In other words, an AC coupling capacitance is allowed while blocking common mode voltage of LC VCO's VoutP and VoutM, and use a resistor to set common mode voltage to a separate design based bias voltage VCM. More particularly, capacitor 401 isolates an LC common mode voltage, such as of an LC VCO tank circuit, from the common mode voltage of varactor 400. In other words, capacitor 401 provides voltage isolation for common mode voltage of varactor circuit 400 to that of a larger circuit in which varactor 400 is implemented. Pairs of resistors and capacitors form AC couples in varactor circuit 400. More particularly, capacitors 401 through 404 respectively associated with resistors 421 through 424 form respective AC couples, such as AC couple 409 formed by capacitor 401 and resistor 421. Capacitors 401 through 404 may be metal finger capacitors as illustratively depicted in FIG. 4A. Metal finger capacitors may be more readily implemented in an implementation where an inductor is formed using one or more upper metal layers of an integrated circuit in which varactor 400 is implemented. However, metal finger capacitors need not be used, and other capacitors such as parallel plate capacitors, container capacitors, or other capacitor structures may be used.

Common mode voltage 410 is provided to common mode voltage node 411. Common mode voltage node 411 is coupled between resistor pairs, namely coupled between a pair of resistors 421 and 423 and a pair of resistors 422 and 424. Resistors 421 and 423 are coupled to one another as well as coupled to resistors 422 and 424 at common mode voltage node 411. An end of resistor 421 is connected to gate node 241. One side of capacitor 401 is connected to gate node 241, and another side of capacitor 401 is connected to output node 250. Likewise, resistor 422 has one end connected to common mode voltage node 411 and another end connected to gate node 242. Gate node 242 is connected to one side of capacitor 402, and another side of capacitor 402 is connected to output node 251.

Resistor 423 has one end connected to common mode voltage node 411 and another end connected to source/drain node 233 which is connected to one side of capacitor 403. Another side of capacitor 403 is connected to output node 250. Likewise, resistor 424 has one end connected to common mode voltage node 411 and another end connected to source/drain node 234. Capacitor 404 has one side connected to source/drain node 234 and another side connected to output node 251.

AC couples as described herein may be used for re-positioning varactor voltage, namely output voltages 260 and 261 respectively sourced from voltage output nodes 250 and 251. By decoupling from an LC VCO output common mode voltage, such as of a tank circuit in which varactor circuit 400 is implemented, tuning range may be modified, such as moved or shifted. Thus, tuning range of varactor circuit 400 may be enhanced by setting internal common mode voltage 410 to a high C-V curve gain region of varactor circuit 400 to realize a higher sensitivity for frequency tuning.

Figure 4B:
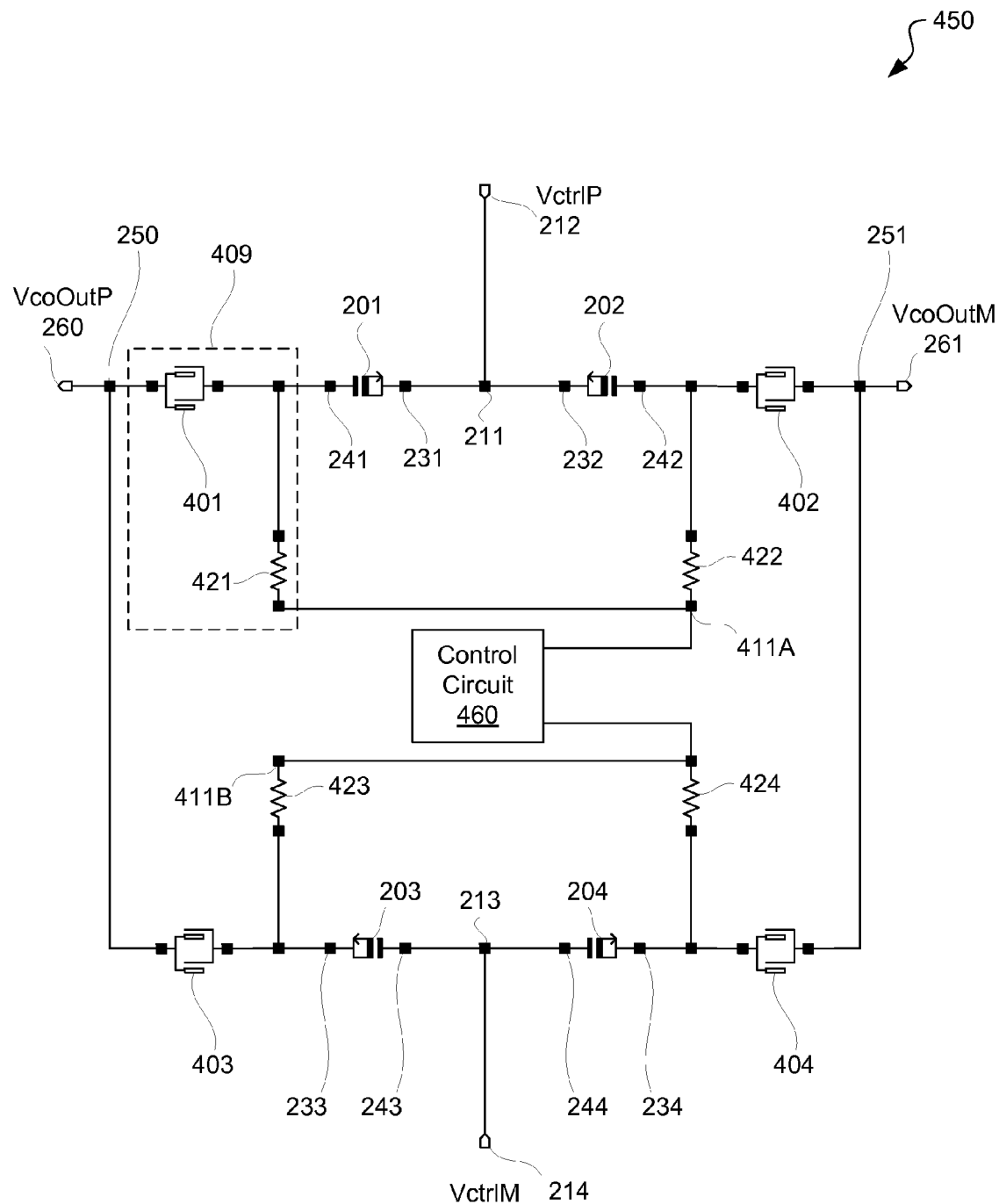
FIG. 4B is a circuit diagram depicting another exemplary embodiment of an AC coupled differential varactor circuit.

FIG. 4B is a circuit diagram depicting another exemplary embodiment of an AC coupled differential varactor circuit 450. Varactor circuit 450 may be for an LC resonator-based PLL or other application for an AC coupled differential varactor circuit. Output voltages 260 and 261 are re-labeled respectively as "VcoOutP" and "VcoOutM" in FIG. 4B to further understanding of a VCO implementation.

Differential varactor circuit 450, like varactor circuit 200 of FIG. 2 and varactor circuit 400 of FIG. 4A, provides a wide LC PLL frequency tuning range by increasing an associated intrinsic varactor C-V curve gain and improves LC PLL supply noise immunity with a differential control voltage topology. Again, a differential control voltage provides improved supply noise immunity as compared with a single-ended control voltage implementation. Thus, even though a single-ended control voltage implementation may be used as described herein, a differential control voltage embodiment is described for purposes of clarity.

Many of the components of varactor circuits 200 of FIGS. 2 and 400 of FIG. 4A are the same as those found in varactor circuit 450, and accordingly same description is not repeated. Varactor circuit 450 has a bi-furcated common mode voltage node, namely common mode voltage nodes 411A and 411B. Nodes 411A and 411B are coupled to one another via control circuit 460. In other words, resistors 423 and 424 are directly connected to one another via node 411B, and resistors 421 and 422 are directly connected to one another via node 411A. However, resistors 421 through 424 are no longer all directly connected to one another as they were in varactor circuit 400 of FIG. 4A, but rather are alternately coupled to one another via control circuit 460, as described in additional detail with reference to FIG. 9.

Figure 9:
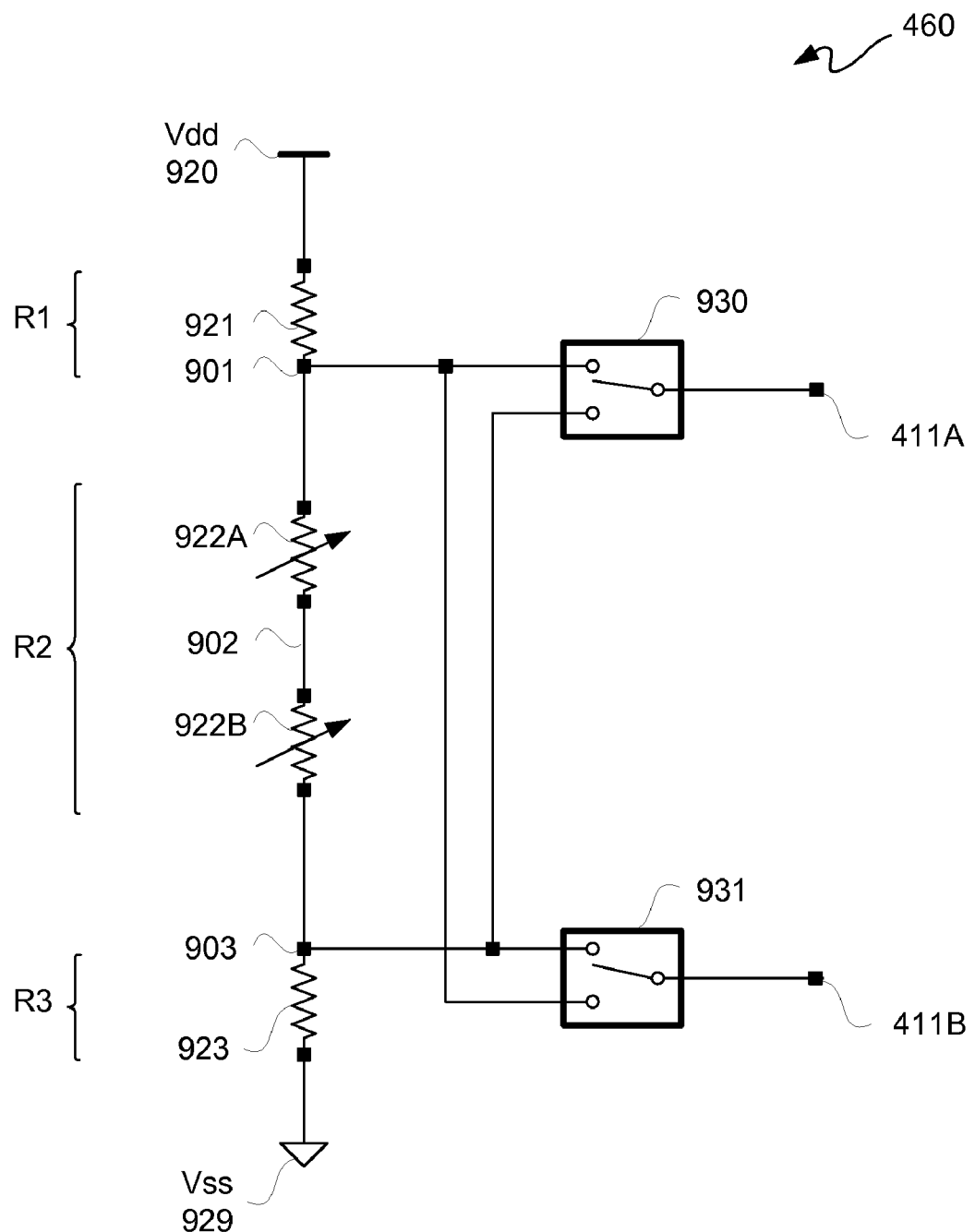
FIG. 9 is a circuit diagram depicting an exemplary embodiment of a control circuit of the AC coupled differential varactor circuit of FIG. 4B.

FIG. 9 is a circuit diagram depicting an exemplary embodiment of control circuit 460. Control circuit 460 includes polarity controlled switching devices, which are illustratively generally depicted as switches 930 and 931, and a variable resistance, which is illustratively depicted as combination of fixed and variable resistors. It should be understood that circuitry other than multi-pole switches, such as transistors, may be implemented for performing switching as described with general reference to switches 930 and 931.

More particularly, a resistive load R1, namely fixed resistor 921, is connected between a supply voltage, such as Vdd 920, and a first voltage divider node 901. A resistive load R2, namely variable resistors 922A and 922B connected in series at node 902, is connected between first voltage divider node 901 and a second voltage divider node 903. Another resistive load R3, namely fixed resistor 923 is connected between second voltage divider node 903 and a ground, such as Vss 929.

Switch 930 has two inputs respectively connected to nodes 901 and 903. Moreover, switch 931 has two inputs respectively connected to nodes 901 and 903 but in reverse order from that of switch 930. When switch 930 connects node 411A to node 901 responsive to a first polarity, switch 931 connects node 411B to node 903 responsive to such first polarity. When switch 930 connects node 411A to node 903 responsive to a second polarity generally opposite such first polarity, switch 931 connects node 411B to node 901 responsive to such second polarity. Resistors of resistive loads R1, R2, and R3 may be sized and incrementally adjusted to have voltages appearing at nodes 411A and 411B each generally be equal to 0.5(VctrlP+VctrlM).

Thus, it should be understood that resistive loads R1, R2, and R3 provide a voltage divider for apportioning Vdd 920 to adjust common mode voltage. Depending on the values of resistors 921 and 923 and adjusted values of resistors 922A and 922B, common mode voltages at nodes 901 and 903 may be selectively switched to be applied to common mode voltage nodes 411A and 411B responsive to polarity, namely direction of process skew, as described below in additional detail. It should be understood that a voltage divider may, but does not necessarily, equally divide Vdd 920. Furthermore, control circuit 460 may be considered part of a resistance bridge.

Accordingly, it should be understood that: varactor circuit (400) is capable of blocking VCO output common mode level ("CML") and re-centering such CML to a varactor device's optimum high gain region by use of a resistance bridge; and varactor circuit (450) is capable of blocking VCO output CML and re-centering such CML with programmability to accommodate positive or negative process shifts.

Figure 5:
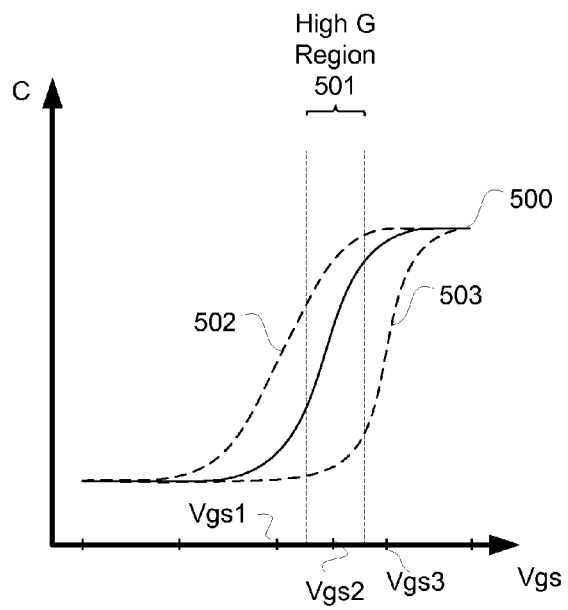
FIG. 5 is a gate-to-source voltage versus capacitance graph depicting exemplary embodiments of various C-V curves for different process skews.

FIG. 5 is a gate-to-source voltage versus capacitance graph depicting exemplary embodiments of various C-V curves for different process skews. C-V curve 500 has a high gain "G" region 501.

High gain region 501 is for a steep slope region of C-V curve 500. Thus within high gain region 501 it should be understood that capacitance ("C") may be significantly varied with slight changes in gate-to-source voltage ("Vgs"). Thus, tuning range is enhanced by having high gain region 501 within a predetermined voltage range, which range may be set to be centered to a target Vgs, such as Vgs2 in this example. Gate-to-source voltage is from a gate of a varactor, such as for varactors 201 through 204 of FIGS. 2, 4A, and 4B, to a respective source. It should be understood that process variation may cause high gain region 501 to be outside the target voltage range. Process variation may be due to a process shift, such as in doping or diffusion or both, or differences between processes of multiple foundries or multiple fabrication facilities, or any combination thereof.

To provide a wide range of capacitance of a varactor circuit, such as varactor circuits 400 and 450 respectively of FIGS. 4A and 4B, and thus a wide range of frequency when implemented in an LC tank VCO for example, it is useful to be able to shift curve 500 to have the steep slope portion of curve 500 fall within such target voltage range. Thus, for example, if dashed line 503 indicated that C-V curve 500 had shifted in the positive gate-to-source voltage direction, such as centered around Vgs3 due to process variation or drift for example, then common mode voltage 410 of varactor circuit 400 of FIG. 4A may be set to shift curve 503 such that the steep slope part of such curve falls in high gain region 501, namely to shift curve 503 in negative gate-to-source voltage direction back toward Vgs2.

Likewise, but for an opposite directional shift, if dashed line 502 indicates a shift of C-V curve 500 in a negative gate-to-source voltage direction, such as centered around Vgs1 due to process variation or drift for example, then common mode voltage 410 of varactor circuit 400 of FIG. 4A may be set such that C-V curve 502 is shifted in a positive gate-to-source voltage direction toward Vgs2 such that the steep slope portion of C-V curve 502 falls within the target voltage region associated with high gain region 501.

Thus, it should be understood that the resistance bridge formed by resistors 421 through 424 in combination with DC decoupling capacitors 401 through 404 allow for programmably moving a C-V curve of varactor circuit 400 of FIG. 4A to a target voltage range such that a steep slope portion of such curve falls within such target voltage range in order to provide a wide range of capacitance to which a varactor circuit 400 may be tuned or programmed. Again, it should be understood that capacitors 401 through 404 respectively may be used for DC decoupling of common mode voltage 410 from sinusoidal voltages respectively output at nodes 250 and 251. Furthermore, it should be understood that the overall capacitive range of C-V for varactor circuit 200 is increased.

In another embodiment, common mode voltage may be set to half of the total of control voltages as in varactor circuit 450 of FIG. 4B. To recapitulate, C-V curves 502 and 503 illustratively depict different varactor performances that deviate from a reference C-V curve 500 due to different process skews, where the highest C-V sensitivity point or range is shifting with such process skews. Such highest C-V sensitivity for different process skews may happen at different Vgs values. Rather than having to redesign VCO output common mode voltage, a control voltage range may be used. In order to make this more clear, Varactor common mode re-centering for highest C-V sensitivity is explained below with the following examples for purpose of clarity and not limitation, as it should be understood that other values may be used.

With reference to FIGS. 4B, 5, and 9 in combination, resistors 421 through 424 may each be less than 10 k ohms and capacitors 401 through 404 may be in a range of approximately one to two picofarads ("pF"). Resistors 421 through 424 may for example be polyresistors.

For a first example, assume for a process skew associated with C-V curve 502, a highest C-V sensitivity of a varactor device occurs at Vgs1=−0.3V. For an LC tank side, VCO output voltages 260 and 261 may each be approximately 0.5V, which is assumed for a Vdd=1V implementation. VctrlP 212 may be assumed to be changing from 0.25V to 0.75V and be centered at 0.5V, and VctrlM 214 may be assumed to be changing from 0.75V to 0.25V and centered at 0.5V. It should be understood that 0.5*(VctrlP+VctrlM) in this example is 0.5V.

Continuing this first example, to center an LC tank frequency for tuning at the highest varactor C-V sensitivity region, Vgs of varactors 201 through 204 is to equal Vgs1. By setting the gate voltage ("Vg") of varactors 201 and 202 at approximately 0.2V for each and setting source/drain voltage ("Vs/d") of varactors 203 and 204 at approximately 0.8V for each, Vgs for each varactor 201 through 204 may be Vgs=−0.3V. In this embodiment, the following values may be used: R1=2 Kohm, R2=6 Kohm, R3=2 Kohm, and setting polarity control to the lower side, namely node 411A connected to node 903 via switch 930 and node 411B connected to node 901 via switch 931. With these settings, a highest C-V sensitivity for all of varactors 201 through 204 may be obtained to provide a widest available capacitance range for this embodiment, and for an LC tank circuit, a largest tuning range may be obtained with respect to this embodiment of varactor circuit 460.

For a second example, assume for a process skew associated with C-V curve 500, which may be a control curve, a highest C-V sensitivity of varactor device occurs at Vgs2=0V. LC tank side voltages are indicated as VcoOutP 260 and VcoOutM 261, and common mode voltage is assumed to be 0.5V for a Vdd equal to 1V implementation. VctrlP 212 may be assumed to be changing from 0.25V to 0.75V and centered at 0.5V, and VctrlM 214 may be assumed to be changing from 0.75V to 0.25V and centered at 0.5V. It should be understood that 0.5*(VctrlP+VctrlM) in this example may be 0.5V.

Continuing this second example, to center an LC tank frequency for tuning at a highest varactor C-V sensitivity region, Vgs of varactors 201 through 204 is to equal Vgs2. By setting Vg of varactors 201 and 202 to approximately 0.5V and by setting Vs/d of varactors 203 and 204 to approximately 0.5V, Vgs of all of varactors 201 through 204 may generally equal 0V. For this example, these settings may be obtained by setting R1 equal to 2 Kohm, R2 equal to 0, R3 equal to 2 Kohm, and polarity control to an upper side, namely node 411A connected to node 901 via switch 930 and node 411B connected to node 903 via switch 931. With these settings, a highest C-V sensitivity for all of varactors 201 through 204 may be obtained to provide a widest available capacitance range for this embodiment, and for an LC tank circuit, a largest tuning range may be obtained with respect to this embodiment of varactor circuit 460.

For a third example, assume that a highest C-V sensitivity of varactor device occurs at Vgs3=0.3V. LC tank side VcoOutP 260 and VcoOutM 261 common mode voltage may be assumed to be 0.5V for a Vdd=1V implementation. VctrlP 212 may be assumed to be changing from 0.25V to 0.75V and centered at 0.5V, and VctrlM 214 may be assumed to be changing from 0.75V to 0.25V and centered at 0.5V. In this embodiment, 0.5*(VctrlP+VctrlM) may be 0.5V.

Continuing this third example, to center an LC tank frequency for tuning at a highest varactor C-V sensitivity region, Vgs of varactors 201 through 204 is to equal Vgs3. By setting the Vg of varactors 201 and 202 to approximately 0.8V and by setting Vs/d of varactors 203 and 204 to approximately 0.2V, Vgs of all of varactors 201 through 204 may generally equal 0.3V. For this example, these settings may be obtained by setting R1 equal to 2 Kohm, R2 equal to 6 Kohm, R3 equal to 2 Kohm, and setting polarity control set to an upper side, namely node 411A connected to node 901 via switch 930 and node 411B connected to node 903 via switch 931. With these settings, a highest C-V sensitivity for all of varactors 201 through 204 may be obtained to provide a widest available capacitance range for this embodiment, and for an LC tank circuit, a largest tuning range may be obtained with respect to this embodiment of varactor circuit 460.

Figure 6:
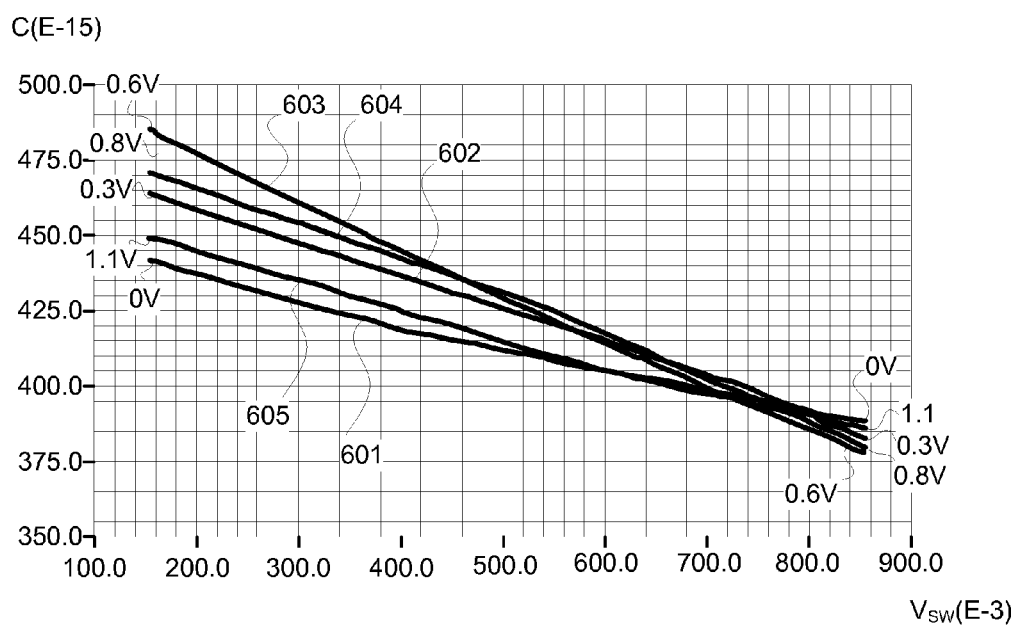
FIG. 6 is a gate-to-source voltage versus capacitance graph depicting an exemplary embodiment of a simulation of a varactor circuit, such as the respective varactor circuits of FIGS. 4A and 4B.

FIG. 6 is a gate-to-source voltage versus capacitance graph depicting an exemplary embodiment of a simulation of a varactor circuit, such as varactor circuits 400 and 450 of FIGS. 4A and 4B. Curves 601, 602, 603, 604, and 605 are for various AC coupled common mode effects, namely setting common mode voltage to 0 volts, 0.3 volts, 0.6 volts, 0.8 volts, and 1.1 volts, respectively, for the simulation of a varactor circuit 400. The x-axis in FIG. 6 is the differential control voltage sweep for a common mode differential control voltage set for example to 0.6 volts. Accordingly, it should be understood that differential varactor circuit 400 having internal AC coupled common mode voltage may have such common mode voltage set to a value where a single varactor device C-V curve has its greatest slope, namely a C-V curve high gain range or portion. Thus, the differential internal AC coupled common mode settings may impact overall differential varactor circuit 400 tuning range. Of course, optimal settings for specific processes may vary from application to application but may be generally identified through simulation.

In FIG. 6, curve 603 is for a simulation of varactor circuit 400 where such C-V curve is obtained by tuning performance for an internal common mode voltage for AC coupling being set to 0.6 volts and differential control voltage signal common mode set to 0.6 volts. This internal common mode setting for AC coupling has roughly the highest C-V curve gain for this exemplary embodiment, as this setting effectively puts each single varactor 201 through 204 as having a gate-to-source voltage close to 0 volts and a gate-to-source voltage that may immediately go positive or negative for a high C-V curve gain and tuning sensitivity. In this exemplary embodiment, capacitor tuning range is from 375 femtofarads ("fF") to 483 fF with similar control voltage sweeping range as in a single-ended control voltage implementation. Accordingly, it should be appreciated that range of varactor circuit 400 capacitance, namely the range of such varactors C-V curve gain and tuning sensitivity, may be approximately double that of a conventional single-ended swing. It should be thus understood that individual intrinsic capacitive range of any of varactors 201 through 204 is less than capacitive range of varactor circuits 200 and 400 respectively of FIGS. 2 and 4. Moreover, capacitive range of varactor circuits 200 and 400 may approximately double that of a similarly positioned single-ended varactor.

Figure 7:
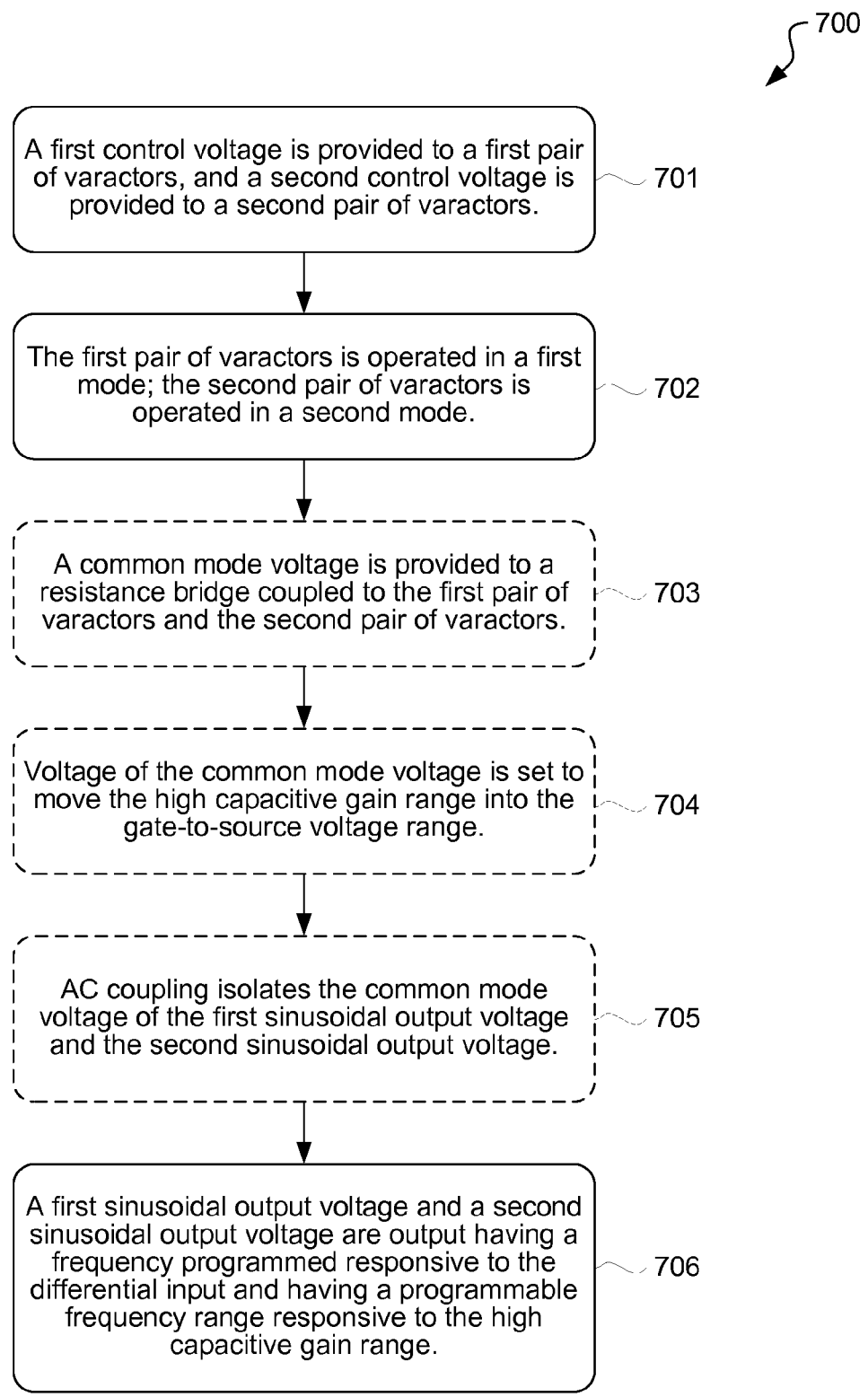
FIG. 7 is a flow diagram depicting an exemplary embodiment of a programmable voltage-controlled oscillation flow.

FIG. 7 is a flow diagram depicting an exemplary embodiment of a programmable voltage-controlled oscillation flow 700. At 701, a first control voltage is provided to a first pair of varactors and a second control voltage is provided to a second pair of varactors. Such pairs of varactors may be of varactor circuits 200 and 400, respectively, of FIGS. 2 and 4. The first control voltage has a first voltage range, and the second control voltage has a second voltage range. The first voltage range and the second voltage range are associated with gate-to-source voltage ranges of varactors. More particularly, the first voltage range and the second voltage range are associated with gate-to-source voltage ranges of varactors, namely a target voltage range within which a C-V curve is to have its high capacitive gain range located. The first control voltage and the second control voltage in combination provide a differential input control voltage. It should be understood that the first control voltage and the second control voltage may be control voltages 212 and 214, respectively of FIGS. 2 and 4.

At 702, a first pair of varactors, such as varactors 201 and 202 of FIGS. 4A and 4B, are operated in a first mode, and a second pair of varactors, such as varactors 203 and 204 of FIGS. 2 and 4, are operated in a second mode. The first mode and the second mode are complementary modes, as previously described herein. The differential input in combination with the complementary modes provides a high capacitive gain range associated with operation of the first pair of varactors and the second pair of varactors in combination.

Optionally at 703 a common mode voltage may be provided to a resistance bridge coupled to the first pair of varactors and the second pair of varactors as described herein. Optionally at 704, if a common mode voltage is provided at 703, such common mode voltage may be set to shift or otherwise move the high capacitive gain range, either in a positive or negative gate-to-source voltage direction, into a target gate-to-source voltage range. Such shifting may be in response to semiconductor process variation as previously described herein. Furthermore, optionally at 704, such common mode voltage may be provided as separate portions of an apportioned supply voltage as previously described with reference to FIG. 4B. Such separate portions may be selectively provided responsive to process skew, if any, as previously described.

Optionally at 705, DC voltage isolation of the common mode voltage may be used by AC coupling, as described elsewhere herein. AC coupling isolates the common mode voltage of a first sinusoidal output voltage and a second sinusoidal output voltage.

At 706, a first sinusoidal voltage and a second sinusoidal voltage may be output. The frequency of such sinusoidal voltages may be programmed responsive to the differential control voltage input provided at 701, where the programmable frequency range is responsive to the high capacitive gain range. The first and second sinusoidal output voltages may be maintained at least approximately 180 degrees out of phase with respect to one another. Moreover, such programmable frequency range may be responsive to shifting a steep slope portion of a C-V curve of a varactor circuit, such as varactor circuits 400 and 450 of FIGS. 4A and 4B, respectively, into a target gate-to-source voltage range.

Figure 8:
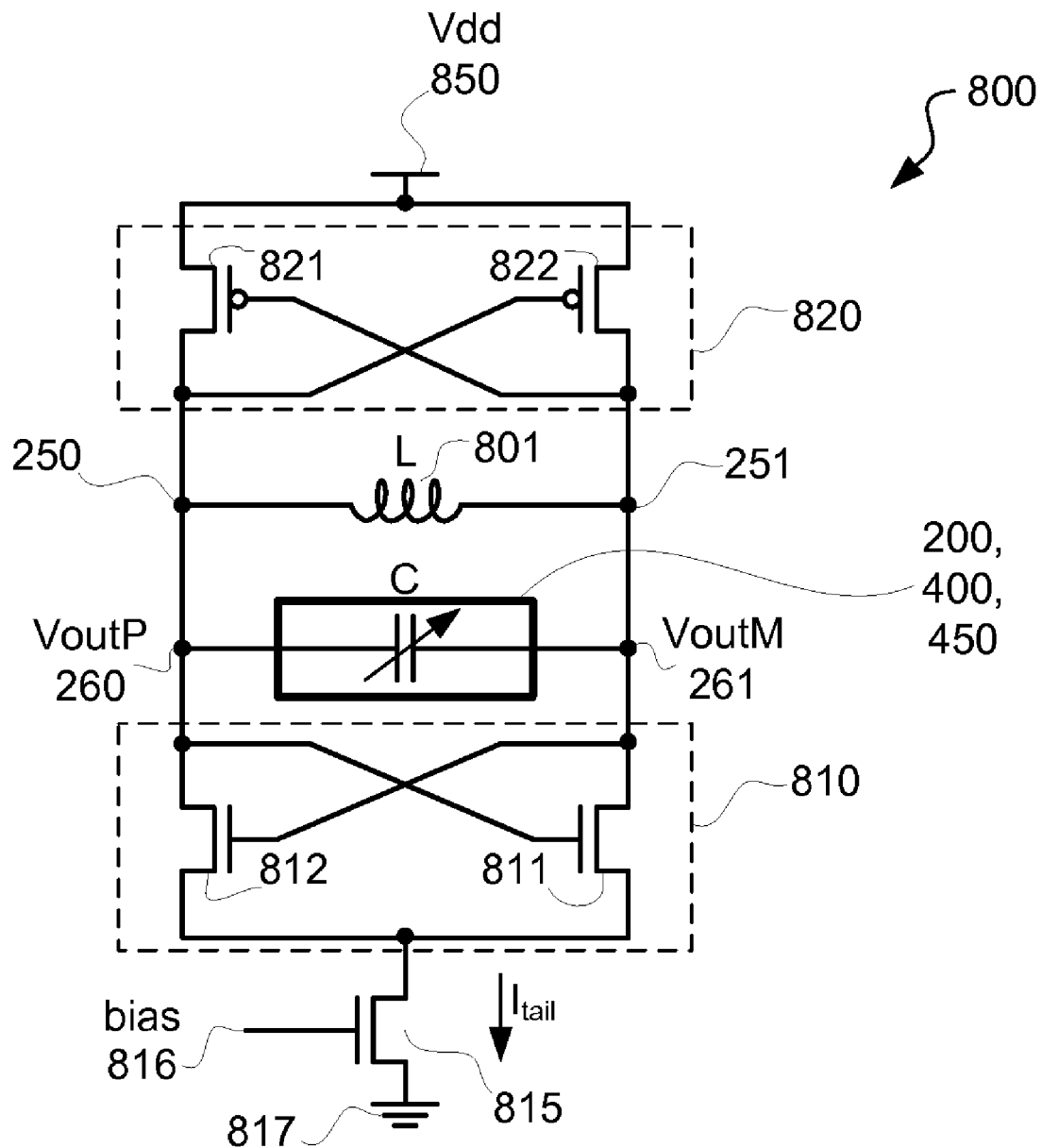
FIG. 8 is a circuit diagram depicting an exemplary embodiment of a voltage-controlled oscillator.

FIG. 8 is a circuit diagram depicting an exemplary embodiment of a VCO 800. VCO 800 may include a varactor circuit, such as varactor circuit 200, 400, or 450 respectively of FIGS. 2, 4A, and 4B. An inductor circuit 801 may be coupled in parallel with varactor circuit 200 or 400 at output nodes 250 and 251. A pair of n-type cross-coupled transistors 810 may have their drain regions respectively connected to output nodes 250 and 251. More particularly, transistor 811 may have its drain region connected to output node 251, and transistor 812 may have its drain region connected to output node 250. Source regions of transistors 811 and 812 may be connected to a drain region of n-type bias transistor 815, which may be used to couple a "tail" current to ground responsive to bias voltage 816.

A gate of bias transistor 815 is coupled to receive a bias voltage 816, and a source region of bias transistor 815 is coupled to ground 817. A gate of transistor 812 may be connected to output node 251, and a gate of transistor 811 may be connected to output node 250. Again, output voltages 260 and 261 may respectively be sourced from output nodes 250 and 251, and such voltages are sinusoidal and may generally be 180 degrees out of phase with respect to one another.

Inductor circuit 801 may be implemented with one or more conventional planar spiral inductors formed using an upper or top metal layer of an integrated circuit in which VCO 800 is implemented. In another embodiment, one or more inductors as described in the co-pending patent application entitled "Embedded Inductor", by Nui Chong and Hong-Tsz Pan, filed Feb. 3, 2010, assigned application Ser. No. 12/699,734 (Attorney Docket Number X-2667 US), which is incorporated by reference herein in its entirety for all purposes, may be implemented in inductor circuit 801.

In another embodiment, a discrete inductor which is external to an integrated circuit in which VCO 800 is integral may be coupled, such as by wire bonding for example, to output nodes 250 and 251. Thus, VCO 800 may be a monolithic device implemented in a single integrated circuit, or may have an external inductor wire bonded to an integrated circuit forming the remainder of VCO 800.

In an embodiment, a pair of cross-coupled p-type transistors 820 may optionally be included. In another embodiment, transistors 820 may be omitted, and nodes 250 and 251 may be directly connected to a supply voltage node, such as Vdd 850. However, having Vdd shorted to the common mode of inductor circuit 801 would not provide as much resistance compensation as the inclusion of a pair of cross-coupled p-type transistors. Accordingly, it shall be assumed that such cross-coupled p-type transistors 820 are implemented in the following description for purposes of clarity by way of example and not limitation.

P-type transistor 821 may have its gate connected to output node 251 and p-type transistor 822 may have its gate connected to output node 250. A drain region of p-type transistor 821 is connected to output node 250, and a drain region of p-type transistor 822 is connected to output node 251. Source regions of p-type transistors 821 and 822 may be coupled to a supply voltage node, such as Vdd 850. In another embodiment, a very "clean" PLL supply voltage, such as may be provided via an external contact of an integrated circuit die in which a VCO 800 is formed, may be used. Thus it should be understood that a supply voltage to VCO 800 need not be limited to the supply voltage level of Vdd, but may exceed the supply voltage level of Vdd in order to have a stronger swing and thus easier to maintain a state within a saturation region of operation. With respect to an FPGA implementation, and in particular an FPGA available from Xilinx, Inc., of San Jose, Calif., a supply contact VCC for PLL may be used.

Accordingly, it should be understood that VCO 800 may be implemented in a PLL or other device in which a VCO is used. LC tank nodes 250 and 251 may be the same as output nodes 250 and 251 of varactor circuits 200, 400, and 450. However, it should further be understood that control nodes of varactor circuits 200, 400, or 450 form part of VCO 800 for differential input thereto as previously described herein. Furthermore, with reference to varactor circuits 400 and 450, when implemented in VCO 800, a common mode voltage control node or nodes, respectively, may optionally be used to provide a common mode voltage as previously described herein.

In addition, it should be understood that output voltages 260 and 261 may be provided to respective buffer circuits or scrubbing circuits in order to clean those signals. As such buffer circuits and scrubbing circuits are well known, they are not described herein in unnecessary detail.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A varactor circuit, comprising:
   a first varactor, a second varactor, a third varactor, and a fourth varactor;
   wherein a first source-drain node of the first varactor is coupled to a first input node;
   a second source-drain node of the second varactor is coupled to the first input node;
   a first gate node of the first varactor is coupled to a first output node;
   a second gate node of the second varactor is coupled to a second output node;
   a third gate node of the third varactor is coupled to a second input node;
   a fourth gate node of the fourth varactor is coupled to the second input node;
   a third source-drain node of the third varactor is coupled to the first output node;
   a fourth source-drain node of the fourth varactor is coupled to the second output node;
   a resistance bridge coupled to the first gate node, the second gate node, the third source-drain node, and the fourth source-drain node;
   the resistance bridge including at least one common mode voltage node; and
   capacitors coupled for DC decoupling of a common mode voltage at the at least one common mode voltage node from a first sinusoidal voltage and a second sinusoidal voltage respectively at the first output node and the second output node;
   wherein the resistance bridge includes:
   a first resistor and a second resistor coupled to one another between the first gate node and the third source-drain node;
   a third resistor and a fourth resistor coupled to one another between the second gate node and the fourth source-drain node;
   the first resistor, the second resistor, the third resistor, and the fourth resistor connected to one another at the at least one common mode voltage node to couple the common mode voltage to each of the first gate node, the second gate node, the third source-drain node, and the fourth source-drain node; and
   wherein the capacitors include:
   a first capacitor coupled between the first output node and the first gate node;
   a second capacitor coupled between the second output node and the second gate node;
   a third capacitor coupled between the first output node and the third source-drain node; and
   a fourth capacitor coupled between the second output node and the fourth source-drain node.

2. The varactor circuit according to claim 1, wherein the first varactor, the second varactor, the third varactor, and the fourth varactor are accumulation-mode MOS capacitors.

3. The varactor circuit according to claim 2, wherein:
   the first input node and the second input node are respectively for receiving a first control voltage and a second control voltage for differential input; and
   the first output node and the second output node are respectively for providing a first output voltage and a second output voltage.

4. The varactor circuit according to claim 3, wherein:
   the first output voltage and the second output voltage are sinusoidal voltages;
   the first control voltage and the second control voltage are DC voltages; and
   the first output voltage and the second output voltage are at least approximately 180 degrees out of phase with respect to one another.

5. The varactor circuit according to claim 2, wherein the accumulation-mode MOS capacitors each have an n-type source region and an n-type drain region connected to one another for respectively providing the first source-drain node, the second source-drain node, the third source-drain node, and the fourth source-drain node.

6. The varactor circuit according to claim 5, wherein the n-type source region and the n-type drain region of each of the first varactor, the second varactor, the third varactor, and the fourth varactor are in an n-type well that provides a body region for each of the first varactor, the second varactor, the third varactor, and the fourth varactor.

7. The varactor circuit according to claim 1, wherein:
   the first resistor and the third resistor are connected to one another between the first gate node and the second gate node at a first common mode voltage node of the at least one common mode voltage node;
   the second resistor and the fourth resistor are connected to one another between the third source-drain node and the fourth source-drain node at a second common mode voltage node of the at least one common mode voltage node; and
   the first resistor and the third resistor are coupled to the second resistor and the fourth resistor via a control circuit connected to the first common mode voltage node and the second common mode voltage node.

8. A voltage-controlled oscillator, comprising:
a varactor circuit coupled in parallel with an inductor circuit at a first output node and a second output node;
a first pair of cross-coupled transistors coupled to the varactor circuit and the inductor circuit at the first output node and the second output node;
a bias transistor coupled between the first pair of cross-coupled transistors and ground; and
a gate of the bias transistor coupled for receiving a bias voltage;
wherein the varactor circuit includes:
 a first varactor, a second varactor, a third varactor, and a fourth varactor;
 a first source-drain node of the first varactor and a second source-drain node of the second varactor are coupled to a first input node;
 a first gate node of the first varactor is coupled to the first output node;
 a second gate node of the second varactor is coupled to the second output node;
 a third gate node of the third varactor and a fourth gate node of the fourth varactor are coupled to a second input node;
 a third source-drain node of the third varactor is coupled to the first output node;
 a fourth source-drain node of the fourth varactor is coupled to the second output node; and
 a resistance bridge coupled to the first gate node, the second gate node, the third source-drain node, and the fourth source-drain node;
the resistance bridge including at least one common mode voltage node, and capacitors coupled for DC decoupling of a common mode voltage at the at least one common mode voltage node from a first sinusoidal voltage and a second sinusoidal voltage respectively at the first output node and the second output node;
wherein the resistance bridge includes:
 a first resistor and a second resistor coupled to one another between the first gate node and the second gate node at a first common mode voltage node of the at least one common mode voltage node;
 a third resistor and a fourth resistor coupled to one another between the third source-drain node and the fourth source-drain node at a second common mode voltage node of the at least one common mode voltage node; and
wherein the capacitors include:
 a first capacitor coupled between the first output node and the first gate node:
 a second capacitor coupled between the second output node and the second gate node;
 a third capacitor coupled between the first output node and the third source-drain node; and
 a fourth capacitor coupled between the second output node and the fourth source-drain node.

9. The voltage-controlled oscillator according to claim 8, wherein the first varactor, the second varactor, the third varactor, and the fourth varactor are accumulation-mode MOS capacitors.

10. The voltage-controlled oscillator according to claim 9, wherein:
the first input node and the second input node are respectively for receiving a first control voltage and a second control voltage for differential input; and
the first output node and the second output node are respectively for providing a first output voltage and a second output voltage.

11. The voltage-controlled oscillator according to claim 10, further comprising:
a second pair of cross-coupled transistors coupled to the varactor circuit and the inductor circuit at the first output node and the second output node; and
the second pair of cross-coupled transistors coupled to a supply voltage node.

12. The voltage-controlled oscillator according to claim 11, wherein:
the first pair of cross-coupled transistors are nMOS transistors;
the second pair of cross-coupled transistors are pMOS transistors;
a gate of a first nMOS transistor of the nMOS transistors and a drain of a second nMOS transistor of the nMOS transistors are connected to the first output node;
a gate of the second nMOS transistor and a drain of the first nMOS transistor are connected to the second output node;
a gate of a first pMOS transistor of the pMOS transistors and a drain of a second pMOS transistor of the pMOS transistors are connected to the first output node;
a gate of the second pMOS transistor and a drain of the first pMOS transistor are connected to the second output node;
a source of each of the first nMOS transistor and the second nMOS transistor are connected to a drain of the bias transistor; and
a source of each of the first pMOS transistor and the second pMOS transistor are connected to the supply voltage node coupled to receive a supply voltage.

13. The voltage-controlled oscillator according to claim 8, wherein:
the first resistor and the second resistor are coupled to the third resistor and the fourth resistor via a control circuit connected to the first common mode voltage node and the second common mode voltage node.

14. The voltage-controlled oscillator according to claim 13, wherein a supply voltage is provided via a PLL voltage contact of an integrated circuit die in which the varactor circuit is formed.

15. A method for providing a programmable voltage-controlled oscillation, comprising:
providing a first control voltage to a first pair of varactors;
providing a second control voltage to a second pair of varactors;
wherein the first control voltage has a first voltage range;
wherein the second control voltage has a second voltage range;
wherein the first voltage range and the second voltage range are associated with a gate-to-source voltage range of high capacitive gain range;
wherein the first control voltage and the second control voltage in combination provide a differential input;
operating the first pair of varactors in a first mode;
operating the second pair of varactors in a second mode;
wherein the first mode and the second mode are complementary modes;
wherein the differential input in combination with the complementary modes provides the high capacitive gain range associated with operation of the first pair of varactors and the second pair of varactors in combination;
providing a resistance bridge coupled to a first varactor and a second varactor of the first pair of varactors, and to a third varactor and a fourth varactor of the second pair of varactors;

the resistance bridge including at least one common mode voltage node, and capacitors coupled for DC decoupling of a common mode voltage at the at least one common mode voltage node from a first sinusoidal output voltage and a second sinusoidal output voltage respectively at a first output node and a second output node;

wherein the resistance bridge includes:
- a first resistor and a second resistor coupled to one another between the first varactor and the third varactor;
- a third resistor and a fourth resistor coupled to one another between the second varactor and the fourth varactor;
- the first resistor, the second resistor, the third resistor, and the fourth resistor coupled to one another at the at least one common mode voltage node to couple the common mode voltage to each of the first varactor, the second varactor, the third varactor, and the fourth varactor; and wherein the capacitors include:
- a first capacitor coupled between the first output node and the first varactor;
- a second capacitor coupled between the second output node and the second varactor;
- a third capacitor coupled between the first output node and the third varactor; and
- a fourth capacitor coupled between the second output node and the fourth varactor; and outputting the first sinusoidal output voltage and the second sinusoidal output voltage having a frequency programmed responsive to the differential input and having a programmable frequency range responsive to the high capacitive gain range.

16. The method according to claim 15, further comprising:
providing the common mode voltage to the resistance bridge coupled to the first pair of varactors and the second pair of varactors;
setting voltage of the common mode voltage to move the high capacitive gain range into the gate-to-source voltage range responsive to semiconductor process variation; and
DC voltage isolating the common mode voltage for AC coupling of the first sinusoidal output voltage and the second sinusoidal output voltage for the outputting.

17. The method according to claim 16, wherein:
the providing of the common mode voltage to the resistance bridge includes:
apportioning a supply voltage to provide a first common mode voltage portion and a second common mode voltage portion; and
selectively providing the first common mode voltage portion and the second common mode voltage portion as the common mode voltage to respective common mode voltage nodes of the resistance bridge respectively coupled to the first pair of varactors and the second pair of varactors for re-centering common mode level associated with the common mode voltage.

18. The method according to claim 15, wherein:
the first resistor and the second resistor are coupled to the third resistor and the fourth resistor via a control circuit connected to the first common mode voltage node and the second common mode voltage node.

19. The method according to claim 18, wherein:
the control circuit has an adjustable resistance voltage divider coupled between a supply voltage node and ground; and
the control circuit further has a switch circuitry for selectively coupling:
a first divided voltage of a first voltage divider node of the voltage divider to the first common mode voltage node and a second voltage of a second voltage divider node of the voltage divider to the second common mode voltage node; and
the first divided voltage of the first voltage divider node of the voltage divider to the second common mode voltage node and the second voltage of the second voltage divider node of the voltage divider to the first common mode voltage node.

* * * * *